Figure 1:
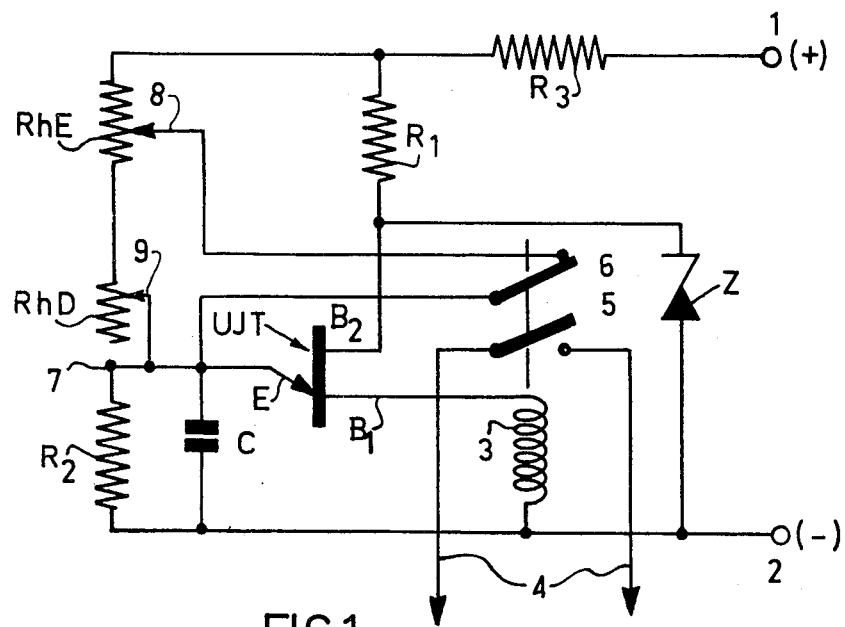

United States Patent [19]

de Fligue et al.

[11] 4,013,931

[45] Mar. 22, 1977

[54] VOLTMETRIC SYSTEM COMPRISING AN ELECTROMAGNETIC RELAY

[76] Inventors: Wladimir de Fligue, 203 rue d'Aulnay, Le Plessis-Robinson (Hauts-de-Seine); Claude Henri Mottet, 70 rue de la Gare, Ezanville (Val-d'Oise), both of France

[22] Filed: July 24, 1975

[21] Appl. No.: 598,834

[30] Foreign Application Priority Data

Aug. 7, 1974 France .............................. 74.27470

[52] U.S. Cl. .................................. 361/187; 361/206
[51] Int. Cl.² ...................................... H01H 47/32
[58] Field of Search ......... 317/31, 148.5 B, DIG. 5, 317/148.5 R; 307/235 N, 252 R, 301, 283, 130, 131

[56] References Cited
UNITED STATES PATENTS 3,182,227  5/1965  Brittain et al. .......... 317/148.5 B X
3,277,280  10/1966  Staples et al. ........... 317/148.5 B X
3,493,816  2/1970  Monigal et al. ......... 317/148.5 B X

*Primary Examiner*—Harry Moose

[57] ABSTRACT

A system of electromagnetic relays supplied by a substantially d.c. input voltage, comprising a unijunction transistor, whereof, between the electrodes, the connection of the two bases and the connection of the emitter and one of the bases are connected in series to one of the terminals of the winding of the relay for supplying the said winding by energizing the transistor, the voltage at the terminals of the assembly of the bases of the unijunction transistor and the winding being stabilized, while the emitter of the unijunction transistor is connected to a point in a resistive network of the system in such a way as to at least ensure a supply to the said winding which ensures the making of the relay for a clearly defined value of the d.c. input voltage.

6 Claims, 2 Drawing Figures

VOLTMETRIC SYSTEM COMPRISING AN ELECTROMAGNETIC RELAY

The present invention relates to a voltmetric system comprising an electromagnetic relay.

There are numerous industrial applications requiring relays which make and break for a clearly defined control voltage no matter whether this is a.c. or d.c.

To achieve this result numerous constructions are used which exclude customary electromagnetic relays because those which are at present available have an inadequate precision.

If accurate electromagnetic relays are used at around the critical control voltage pressure between contacts is close to zero making the contact sensitive to vibrations and shocks and facilitating fusing of their elements.

So-called galvanometric (moving coil) relays provide a technically acceptable but financially unacceptable solution. In addition, their breaking capacity is low making it necessary to use intermediate electromagnetic relays in the power circuits.

The desired result can be obtained by so-called "static" relays, but a satisfactory system of electronic components would include a large number thereof, so that the price of the system would become excessive.

The present invention obviates these disadvantages, making it possible to obtain a precise voltmetric operation such as is industrially required under acceptable economic conditions.

The voltmetric system according to the invention comprises, in the supply circuit of the coil of an electromagnetic relay, the emitter—first base connection of a unijunction transistor, whose two bases are polarized by a stabilised voltage, whilst the emitter receives a voltage which is a function of the input voltage of this system.

For stabilisation the bases are preferably connected to the terminals of a Zener diode supplied by the input voltage through a resistor.

The electromagnetic relay can be supplied through an amplifier controlled by the unijunction transistor if its inherent sensitivity is not sufficient. It is advantageous to use a relay whose sensivity is compatible with the unijunction transistor current and to supply this relay directly by the transistor. In this case the relay making threshold must obviously be regulated for a or firing voltage lower than the transistor energizing voltage.

Thus, when the peak voltage is reached the avalanche current appears in the transistor, leading to the making of the relay operating on hit or miss, in such a way that its contacts are operated without passing through a zero pressure state.

Conversely, sudden breaking of the relay occurs when the input voltage imposes on the emitter a voltage which is below the minimum voltage (so-called valley voltage) of the current-voltage characteristic of the unijunction transistor.

However, it is known that for a unijunction transistor the energizing or peak voltage is much higher than the valley voltage, which can bring about unstable operation.

This disadvantage is eliminated by connecting the emitter of the unijunction transistor to an intermediate point of a voltage divider to which the input voltage is applied, whereby part of this voltage divider is, prior to the making of the relay, short-circuited by a normally closed relay operated contact.

Thus, during the energizing of the unijunction transistor causing the making of the relay, by opening the rest normally closed contact the resistance of the voltage divider is increased in such a way that the voltage level at the point where the emitter supply is taken, becomes close to the valley voltage level. Moreover, the reduction of current caused by the increase of the resistance of the circuit supplying the emitter is at least partly compensated by the fact that between the peak voltage and the valley voltage the transistor characteristic curve has a negative slope.

Despite the variation between the peak and valley voltages by arranging portions of the voltage divider in rheostats for a given input voltage the variation between the making and breaking points can be reduced to the desired level. Thus, the variation can be reduced to only 1% of this input voltage.

Thus, the device according to the invention is particularly suitable for monitoring voltage values for purpose of regulation, for example, for charging accumulators, for controlling speeds whose reference is supplied by a tachometric dynamo, etc.

Figure 2:
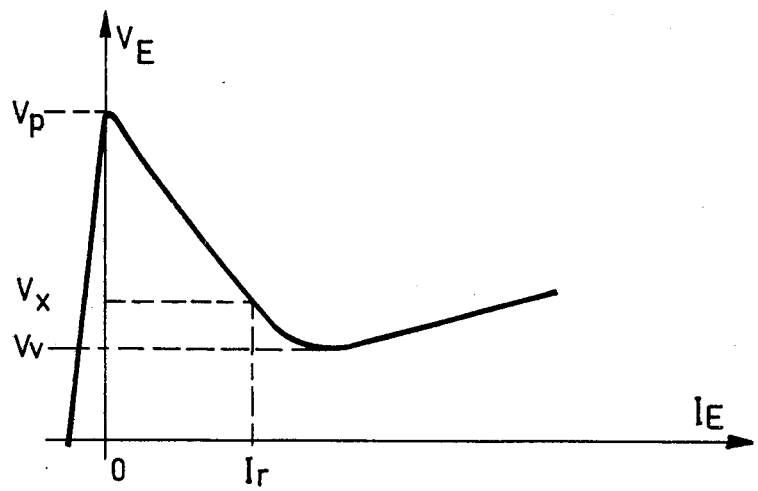

In the attached drawings FIG. 1 shows an example of a voltmetric system according to the invention and FIG. 2 shows a unijunction transistor characteristic curve making it easier to understand the operation.

The input voltage (d.c. or rectified and filtered) is applied to terminals 1 and 2. In parallel it supplies, via current limiting resistor $R_1$ Zener diode Z and the connection between bases $B_1$, $B_2$ of unijunction transistor UJT, whereby this connection is in series with the coil 3 of an electromagnetic relay. For controlling an external circuit represented schematically by the arrows 4, this relay comprises a make contact 5 (normally open) and a break contact 6 (normally closed).

The input voltage is also applied to a voltage divider formed by potentiometer RhE, rheostat RhD (having a floating end) and the resistor $R_2$, shunted by a capacitor C.

The point 7 of this voltage divider is connected to the emitter E of transistor UJT, whilst the break contact 6 short-circuits the part of the voltage divider between the slide 8 of potentiometer RhE and point 7. In turn, rheostat RhD comprises a slide 9 connected to point 7. Finally, a resistor $R_3$ makes it possible to adapt the device to input voltages having higher rated values.

The device functions in the following manner:

By means of the diode Z, the interbase voltage of transistor UJT is stabilised to a predetermined value in excess of the making voltage of the relay, but, due to the high value of the interbase resistance only a small part of this voltage is applied at rest to coil 3.

Before starting the avalanche in the transistor, substantially no current flows between the emitter and the base $B_1$ of the transistor.

When the voltage taken by slide 8 reaches the value $V_p$ (FIG. 2) the conduction of connection $EB_1$ commences and current flows through coil 3. To this current is added the current which, via register $R_1$, passes through the interbase connection due to the fact that the resistance of the latter has considerably decreased due to the energizing of the transistor UJT.

Thus, the relay is energized, its make contact 5 closes and its break contact 6 opens. During this opening the emitter voltage becomes that of point 7, whereby the voltage divider portion comprised between sliders 8 and 9 is now in series in the voltage divider.

Thus, for example, the emitter voltage assumes the operating value $V_r$ close to $V_v$ (valley voltage) below which the transistor is de-energized.

By selecting the position of slide 9 it is possible to determine the input voltage value corresponding to the value $V_v$ relative to point 7, i.e. the de-energizing voltage of transistor UJT.

Obviously $V_r$ can be very close to $V_v$ within the stability limits of the system.

The intensity $I_r$ which maintains the relay in the made state corresponds to value $V_r$.

However, the insertion of a resistor in the voltage divider by opening contact 6, reduces the current supplied by the emitter in such a way that the attraction of the coil, despite the compensation due to the negative slope of the characteristic curve can be inadequate to make the relay.

This disadvantage can be eliminated by only opening the contact 6 at the end of travel and more particularly after closing contact 5.

The presence of capacitor C also prevents this disadvantage, whereby in the rest position this capacitor is charged at the voltage existing in slide 8.

As soon as the opening of contact 6 starts, capacitor C is discharged in the emitter-first base connection, thus supplying to the relay a supplementary make pulse.

As the energizing or de-energizing phenomena are sudden, the relay always functions on hit or miss, its own make or break threshold precision is not involved.

As the characteristics of the unijunction transistors are substantially independent of temperature, if temperature compensation of the Zener diode takes place the device according to the invention ensures making and breaking for precise voltage values which are also independent of temperature.

Moreover, in FIG. 1 each of the make controls (RhE) or break controls (RhD) does not influence the control obtained by the other. As a matter of fact in rest position (contact 6 closed) emitter voltage is determined by the sliders 8, the divider portion comprised between points 8 and 7 being fully short-circuited. Conversely, when contact 6 is open, the resistance members are inserted in the voltage divider and slider 8 is "isolated" with respect to slider 9 so that the position of the latter on rheostat RhD fully determines now the emitter voltage. In other words the controls of the make and break values are independent. This independence makes it possible, for example, to space apart the making and breaking points in an input voltage ratio varying from 3 to 1, or, conversely to move them together to within about 1%.

As the electromagnetic part of the system operates on hit or miss and the remainder of the components is static the system is not influenced by shocks and vibrations.

If the electromagnetic relay is not sufficiently sensitive to make using only the unijunction transistor current, an amplifier formed by one or several transistors can be inserted between $B_1$ and coil 3.

As a result of resistor $R_3$ which determines the supply voltage of the system a device such as that illustrated in FIG. 1, designed for a low value d.c. voltage, for example, 12 volts, is also suitable for much higher voltages.

The invention is applied more particularly to the detection of the value of maximum and/or minimum voltages, for example, for charging accumulators or for controlling the speed of equipment, measured by means of tachometric dynamos.

What we claim is:

1. A device responsive to a substantially direct voltage source of variable voltage comprising: voltage divider means connected to said source and having an intermediate portion; a unijunction transistor having its emitter connected to the lower voltage end of said intermediate portion; an electromagnetic relay having: a coil connected in series with the bases of said transistor and said source, at least one normally open contact, and one normally closed contact shunting said intermediate portion and voltage stabilizing means shunting the series-connected transistor bases and coil.

2. A device according to claim 1 wherein said voltage divider means has a variable resistor, at least one end of said intermediate portion comprises a slider cooperating with said variable resistor of said divider means.

3. A device according to claim 1 including a capacitor means connected between the emitter of said transistor and one terminal of said coil, the other terminal of said coil being connected to said transistor bases.

4. A device according to claim 1 wherein said relay is adjusted for closing said normally open contact before opening of said normally closed contact.

5. A device according to claim 1 wherein said voltage divider means has high and low potential terminals, said divider means comprising between said high and low terminals: a series connection of a potentiometer with a slider and of a rheostat with a slider, said rheostat having a floating end, said divider intermediate portion being between the slider of said potentiometer and the slider of said rheostat, the slider of said rheostat being connected to the emitter of said transistor, and fixed resistor means connected between said emitter and said one terminal of said coil.

6. A device according to claim 1 including capacitor means connected between the emitter of said transistor and one terminal of said coil, the other terminal of said coil being connected to said transistor bases, at least one end of said intermediate portion comprising a slider cooperating with said variable resistor of said divider means, said relay being adjusted for closing said normally open contact before opening of said normally closed contact, said voltage divider means having high and low potential terminals, said divider means comprising between said high and low terminals: a series connection of a potentiometer with a slider and of a rheostat with a slider, said rheostat having a floating end, said divider intermediate portion being between the slider of said potentiometer and the slider of said rheostat, the slider of said rheostat being connected to the emitter of said transistor, and fixed resistor means connected between said emitter and said one terminal of said coil, adjustments of said potentiometer and said rheostat being independent of each other, the contact pressure of said contacts being substantially constant and having a substantially large magnitude.

* * * * *